(12) United States Patent
Wu

(10) Patent No.: US 8,334,182 B2
(45) Date of Patent: Dec. 18, 2012

(54) METHOD FOR MANUFACTURING NON-VOLATILE MEMORY

(75) Inventor: Chao-I Wu, Hsinchu (TW)

(73) Assignee: MACRONIX International Co., Ltd., Hsinchu (TW)

(*) Notice: Subject to any disclaimer, the term of this patent is extended or adjusted under 35 U.S.C. 154(b) by 0 days.

(21) Appl. No.: 13/117,443

(22) Filed: May 27, 2011

(65) Prior Publication Data
US 2011/0230024 A1    Sep. 22, 2011

Related U.S. Application Data

(62) Division of application No. 11/258,490, filed on Oct. 24, 2005, now Pat. No. 8,138,540.

(51) Int. Cl.
*H01L 21/336* (2006.01)

(52) U.S. Cl. . 438/270; 438/259; 257/314; 257/E21.679; 257/E29.309

(58) Field of Classification Search .............. 257/314, 257/324, E21.679, E29.309; 438/259, 270, 438/589
See application file for complete search history.

(56) References Cited

U.S. PATENT DOCUMENTS
7,323,388 B2 * 1/2008 Deppe et al. ............... 438/270

* cited by examiner

*Primary Examiner* — David Vu
(74) *Attorney, Agent, or Firm* — J.C. Patents

(57) ABSTRACT

A method for manufacturing a non-volatile memory is provided. The method comprises steps of providing a substrate. Thereafter, a plurality of first doped regions are formed in the substrate and then a plurality of trenches are formed in a portion of the first doped regions. A plurality of second doped regions are formed in a portion of the substrate under the bottoms of the trenches respectively. Then, a charge storage layer is formed conformal to a surface of the substrate and a conductive layer is formed over the substrate, wherein the conductive layer covers the charge storage layer and fills in the trenches.

9 Claims, 5 Drawing Sheets

METHOD FOR MANUFACTURING NON-VOLATILE MEMORY

CROSS-REFERENCE TO RELATED APPLICATION

This is a divisional application of and claims the priority benefit of patent application Ser. No. 11/258,490, filed on Oct. 24, 2005, which is now allowed. The entirety of the above-mentioned patent application is hereby incorporated by reference herein and made a part of this specification.

BACKGROUND OF THE INVENTION

1. Field of Invention

The present invention relates to a semiconductor device and a manufacturing method thereof. More particularly, the present invention relates to a non-volatile memory and a fabricating method thereof.

2. Description of Related Art

The electrically erasable programmable read only memory (EEPROM) possesses the ability to store, read and erase data for several times. Moreover, the EEPROM has the advantage that the stored data is not lost even after the system is power off. Therefore, the EEPROMs are widely used in the personal computers and electronic equipments.

Typical EEPROM is composed of a floating gate and a control gate, which are made of doped polysilicon. When the memory is programmed, the electrons injected into the floating gate uniformly distributes in the polysilicon floating gate layer. However, when there are defects in the tunnel oxide layer under the polysilicon floating gate layer, the leakage is easily produced in the device. Hence, the reliability of the device is decreased.

Currently, in order to solve the leakage problem of the EEPROM, a charge storage layer is used to substitute the polysilicon floating gate. The charge storage layer is made of silicon nitride. Usually, each side of the silicon nitride charge storage layer has a silicon oxide layer so as to form a stacked gate structure including a silicon oxide/silicon nitride/silicon oxide (ONO) complex dielectric layer.

In addition, another advantage obtained from replacing the polysilicon floating gate with the silicon nitride layer is that the electrons are only stored in a portion of the silicon nitride layer over the channel region adjacent to the source region or drain region while the device is programmed. Therefore, during the programming process, the voltages can be applied on the source region and the control gate respectively. Hence, the electrons are stored in a portion of the silicon nitride layer near the drain region with a form of Gaussian distribution. Alternatively, the voltages can be applied on the drain region and the control gate respectively. Hence, the electrons are stored in a portion of the silicon nitride layer near the source region with a form of Gaussian distribution. On the other words, there are two storage regions in a single silicon nitride layer. By properly applying the voltages on the control gate and on either the source region or the drain region, there can be four different storage states, which includes each of the storage regions having one group of electrons with a Gaussian distribution property, either one of the storage regions having one group of electrons with a Gaussian distribution property and none of the electrons stored in both storage regions, in a single silicon nitride layer. That is, a single flash memory cell can present four different storage states. Hence, instead of using the floating gate, the flash memory with a silicon nitride charge storage layer is considered a 2-bit-per-cell memory.

Conventionally, in order to increase the number of bits of a unit cell, a memory structure with a vertical memory cell is developed. This kind of memory cell is a 4-bit-per-cell flash memory. However, between two vertical memory cells, the phenomenon of electron punching through happens easily. Hence, the leakage in the memory structure is induced.

SUMMARY OF THE INVENTION

Accordingly, at least one objective of the present invention is to provide a non-volatile memory capable of increasing the number of bits of a unit cell.

At least another objective of the present invention is to provide a method for manufacturing a non-volatile memory with high density of storage regions.

At least the other objective of the present invention is to provide a method for manufacturing a 3-bit-per-cell non-volatile memory.

To achieve these and other advantages and in accordance with the purpose of the invention, as embodied and broadly described herein, the invention provides a non-volatile memory. The non-volatile memory comprises a substrate, a conductive layer, a charge storage layer, several first doped regions and several second doped regions. The substrate has a plurality of trenches formed therein. The conductive layer is located over the substrate, wherein the conductive layer fills in the trenches. The charge storage layer is located between the substrate and the conductive layer. The first doped regions are located in the substrate adjacent to both sides of the trenches respectively, wherein the first doped regions between the neighboring trenches are separated from each other. The second doped regions are located in a portion of the substrate under the bottoms of the trenches respectively.

In the present invention, the charge storage layer is made of silicon nitride. Also, the present invention further comprises a first dielectric layer located under the charge storage layer, wherein the first dielectric layer is made of silicon oxide. In addition, the present invention further comprises a second dielectric layer located above the charge storage layer, wherein the second dielectric layer is made of silicon oxide. Moreover, the conductive layer is made of doped polysilicon. Also, the non-volatile memory can be a multi-level cell.

The present invention also provides a method for manufacturing a non-volatile memory. The method comprises steps of providing a substrate. Thereafter, a plurality of first doped regions are formed in the substrate and then a plurality of trenches are formed in a portion of the first doped regions. A plurality of second doped regions are formed in a portion of the substrate under the bottoms of the trenches respectively. Then, a charge storage layer is formed conformal to a surface of the substrate and a conductive layer is formed over the substrate, wherein the conductive layer covers the charge storage layer and fills in the trenches.

According to the present invention, the method for forming the first doped regions, the trenches and the second doped regions comprises steps of forming a patterned mask layer on the substrate and then forming the first doped regions in the substrate exposed by the patterned mask layer. A spacer is formed on the sidewall of the patterned mask layer, wherein the spacer covers a portion of the first doped region. The trenches are formed in the substrate exposed by the patterned mask layer and the spacer. The second doped regions are formed under the bottoms of the trenches in the substrate exposed by the patterned mask layer and the spacer. The patterned mask layer and the spacer are removed. The method for forming first doped regions and the second doped regions in the aforementioned method includes an ion implantation process. In the aforementioned method, the patterned mask layer is made of silicon oxide and the spacer is made of silicon nitride or silicon oxide. The method for forming the spacer in the aforementioned method comprises steps of forming a dielectric layer over the substrate, wherein the dielectric layer covers the patterned mask layer and performing a dry etching process on the dielectric layer. In one embodiment, the method for foil ling the trenches and the second doped regions comprises steps of forming a patterned mask layer on the substrate to expose a portion of the first doped regions respectively and then forming the trenches in a portion of the substrate exposed by the patterned mask layer. The second doped regions are formed in the substrate under the bottoms of the trenches respectively. The patterned mask layer is removed. The method for forming the second doped regions in the aforementioned method includes an ion implantation process. The charge storage layer is made of silicon nitride. Furthermore, the method further comprises a step of forming a first dielectric layer between the charge storage layer and the substrate, wherein the first dielectric layer is made of silicon oxide. Moreover, the method further comprises a step of forming a second dielectric layer between the charge storage layer and the conductive layer, wherein the second dielectric layer is made of silicon oxide.

The memory of the present invention has the vertical memory structure and the horizontal memory structure and is a 3-bit-per-cell non-volatile memory. Therefore, the number of the bit storing in a unit cell is increased. According to the present invention, there are three storage regions in a single memory cell so that the storage density of the memory of the present invention is relatively high.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
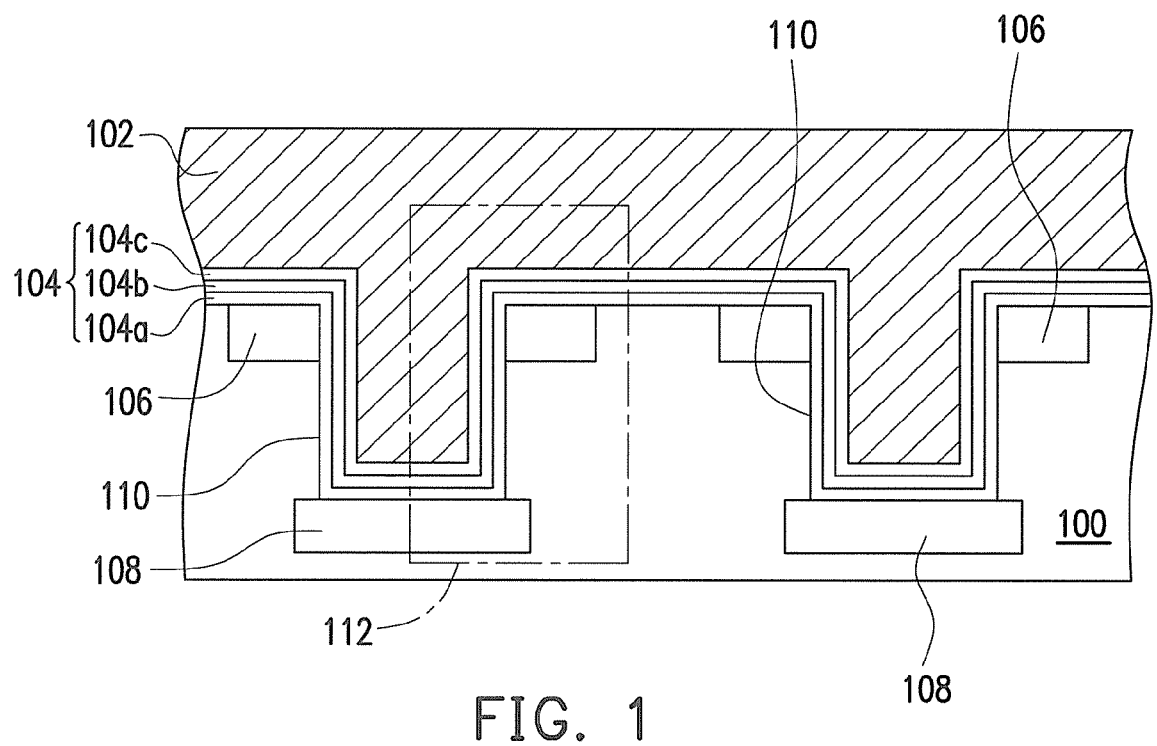
FIG. 1 is a cross-sectional view showing a non-volatile memory according to one preferred embodiment of the present invention.

FIG. 1 is a cross-sectional view showing a non-volatile memory according to one preferred embodiment of the present invention.

As shown in FIG. 1, the non-volatile memory of the present invention comprises a substrate 100, a conductive layer 102, a complex dielectric layer 104, several first doped regions 106 and several second doped regions 108. The substrate 100 has several trenches 110 and the substrate 100 can be, for example but not limited to, a silicon substrate.

The conductive layer 102 is located over the substrate 100 and fills in the trenches 110. The conductive layer 102 can be, for example but not limited to, made of doped polysilicon.

The complex dielectric layer 104 is located between the conductive layer 102 and the substrate 100. The complex layer 104 can be, for example but not limited to, composed of a bottom dielectric layer 104a, a charge storage layer 104b and a top dielectric layer 104c, wherein the bottom dielectric layer 104a and the top dielectric layer 104c can be, for example but not limited to, made of silicon oxide and the charge storage layer can be, for example but not limited to, formed of silicon nitride.

The first doped regions 106 are located at both sides of each of the trenches 110 in the substrate 100 respectively, wherein the first doped regions 106 between the neighboring trenches 110 are separated from each other. Further, the conductive type of the first doped regions 106 can be, for example but not limited to, N type.

The second doped regions 108 are located in the substrate 100 under the bottom of the trenches 110 respectively. Additionally, the conductive type of the second doped regions 108 can be, for example but not limited to, N type.

The non-volatile memory of the present invention can be, for example but not limited to, a multi-level cell (MLC) used for storing multi charges according different programming levels. Taking the memory cell 112 in FIG. 1 as an example, a 2-bit storing process can be performed in a portion of the complex dielectric layer 104 located over the sidewall of the trench 110. Moreover, a 1-bit storing process can be performed in a portion of the complex dielectric layer 104 located between the trenches 110. Therefore, the non-volatile memory of the present invention is a 3-bit-per-cell non-volatile memory. By comparing with the conventional stacked flash memory, storage density of the non-volatile memory is relatively high.

FIGS. 2A through 2D are cross-sectional views illustrating a method for manufacturing a non-volatile memory according to one preferred embodiment of the present invention.

Figure 2A:
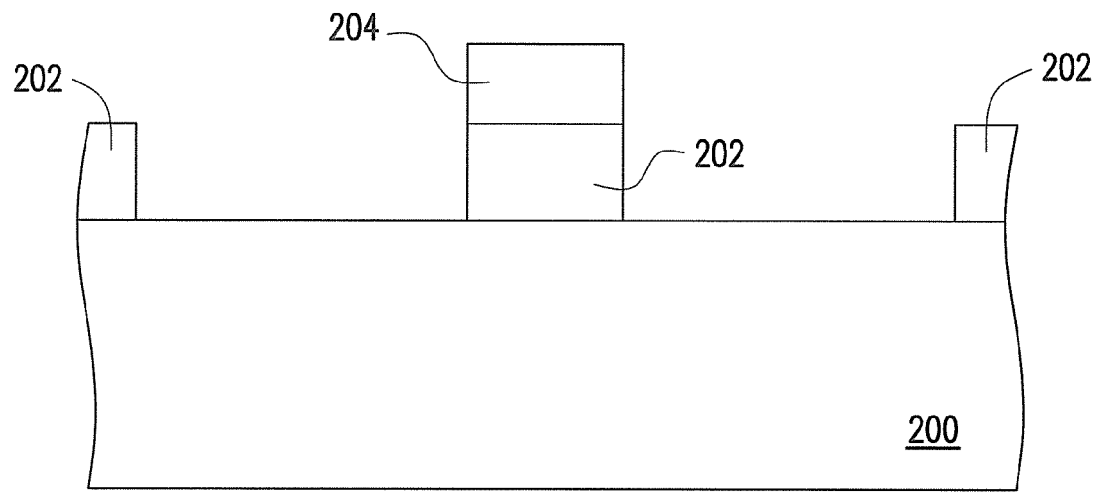
FIGS. 2A through 2D are cross-sectional views illustrating a method for manufacturing a non-volatile memory according to one preferred embodiment of the present invention.

As shown in FIG. 2A, a substrate 200 is provided. A patterned mask layer 202 is formed on the substrate 200. The patterned mask layer 202 can be, for example but not limited to, made of silicon oxide. The method for forming the patterned mask layer 202 comprises steps of forming a mask material layer (not shown) on the substrate 200 by chemical vapor deposition (CVD), forming a patterned photoresist layer 204 on the mask material layer and then performing an etching process to pattern mask material layer by using the patterned photoresist layer 204 as a mask until the patterned mask layer 202 is formed.

Figure 2B:
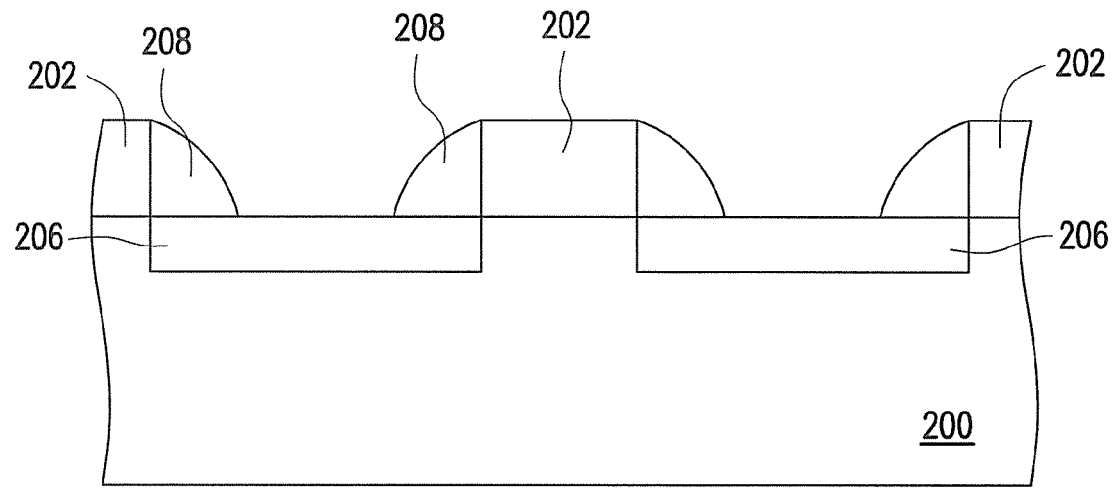

As shown in FIG. 2B, the patterned photoresist layer 204 is removed. Then, a plurality of first doped regions 206 are formed in a portion of the substrate 200 exposed by the patterned mask layer 202. The first doped regions can be, for example but not limited to, N-type doped regions. The method for forming the first doped regions comprises a step of performing an ion implantation process for implanting phosphorous ions into the substrate 200 by using the patterned mask layer 202 as a mask.

Thereafter, a spacer 208 is formed on the sidewall of the patterned mask layer 202 over the substrate 200, wherein the spacer 208 covers a portion of the first doped regions 206. Moreover, the spacer 208 can be, for example but not limited to, made of silicon nitride or silicon oxide. The method for forming the spacer 208 comprises steps of forming a dielectric layer (not shown) over the substrate 200 by using the CVD and then performing a dry etching process on the dielectric layer until the spacer 208 is formed.

Figure 2C:
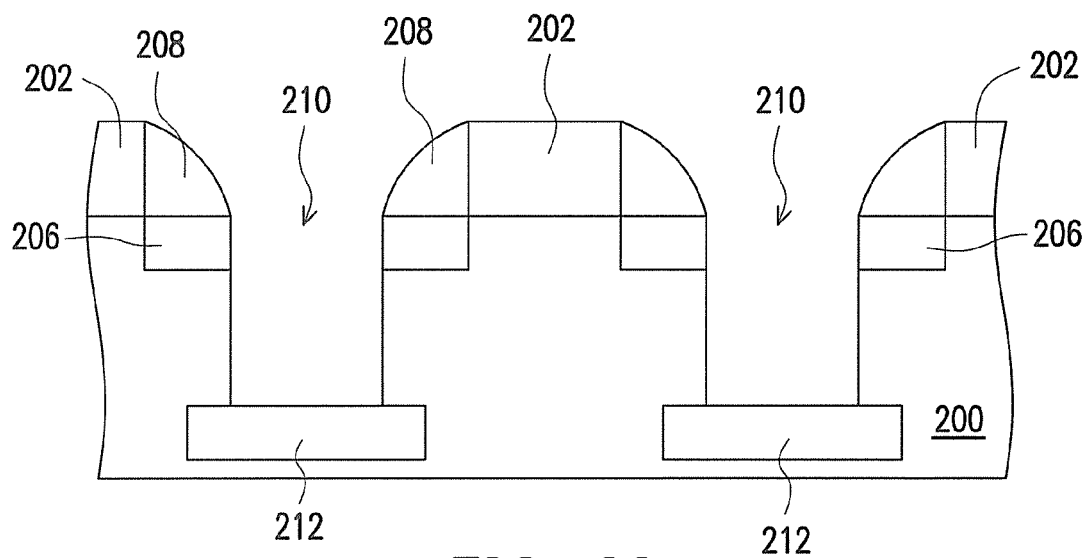

As shown in FIG. 2C, an etching process is performed to form several trenches 210 in the substrate 200 by using the patterned mask layer 202 and the spacer 208 as masks. The etching process can be, for example but not limited to, a dry etching process.

Moreover, a plurality of second doped regions 212 are formed in the substrate 200 under the bottom of the trenches 210 respectively. The second doped regions 212 can be, for example but not limited to, N-type doped regions. The method for forming the second doped regions 212 comprises a step of performing an ion implantation process for implanting phosphorous ions into the substrate 200 by using the patterned mask layer 202 and the spacer 208 as masks.

Figure 2D:
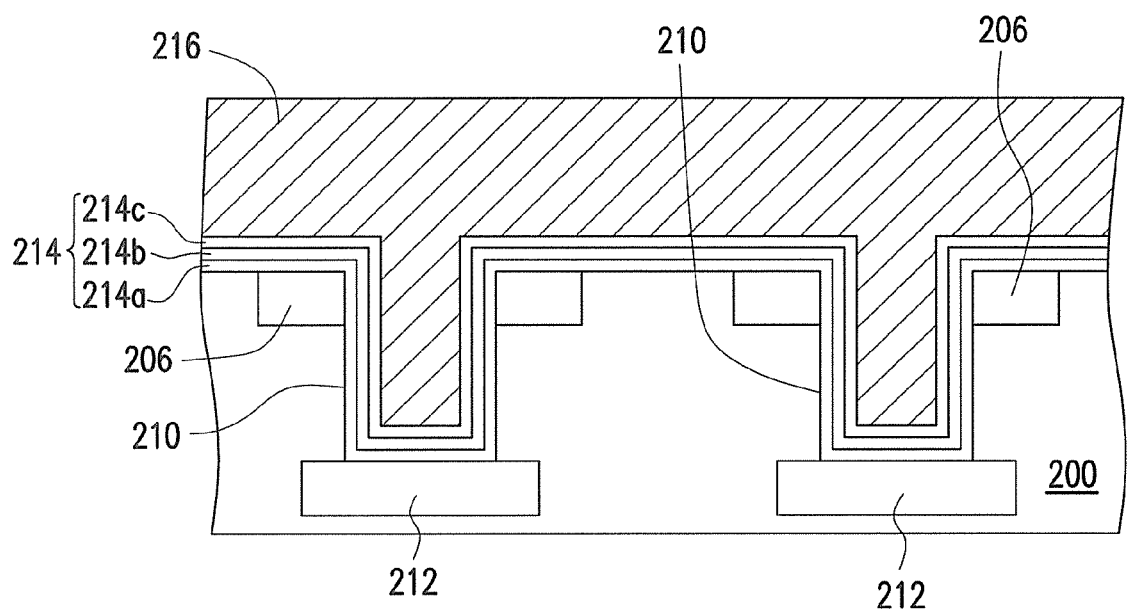

As shown in FIG. 2D, the patterned mask layer 202 and the spacer 208 are removed. The method for removing the patterned mask layer 202 and the spacer 208 can be, for example but not limited to, a dry etching process.

Then, a complex dielectric layer 214 is conformally formed over the substrate 200. The method for forming the complex dielectric layer 214 comprises steps of forming a bottom dielectric layer 214a, a charge storage layer 214b and a top dielectric layer 214c over the substrate 200 sequentially. The bottom dielectric layer 214a can be, for example but not limited to, formed from silicon oxide by using thermal oxidation or CVD. The charge storage layer 214b can be, for example but not limited to, formed from silicon nitride by using CVD. Also, the top dielectric layer 214c can be, for example but not limited to, formed from silicon oxide by using CVD.

Thereafter, a conductive layer 216 is formed over the substrate 200. The conductive layer 216 covers the complex dielectric layer 214 and fills in the trenches 210. The conductive layer 216 can be, for example but not limited to, foamed from doped polysilicon by using polysilicon CVD with in-situ dopping.

The memory formed by applying the aforementioned method has the vertical memory structure and the horizontal memory structure. That is, the memory is a 3-bit-per-cell non-volatile memory with relatively high storage density.

Figure 3A:
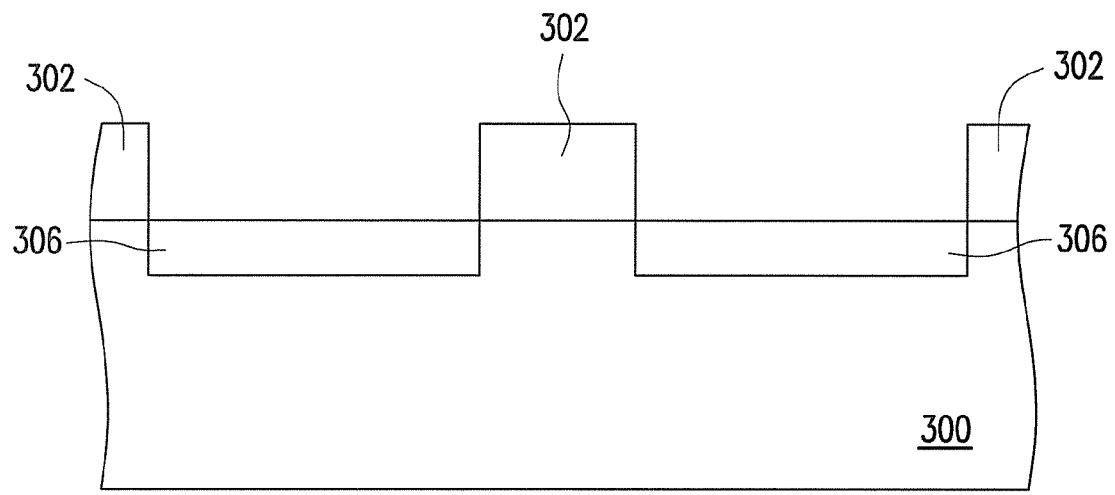
FIGS. 3A through 3C are cross-sectional views illustrating a method for manufacturing a non-volatile memory according to one preferred embodiment of the present invention.
Figure 3B:
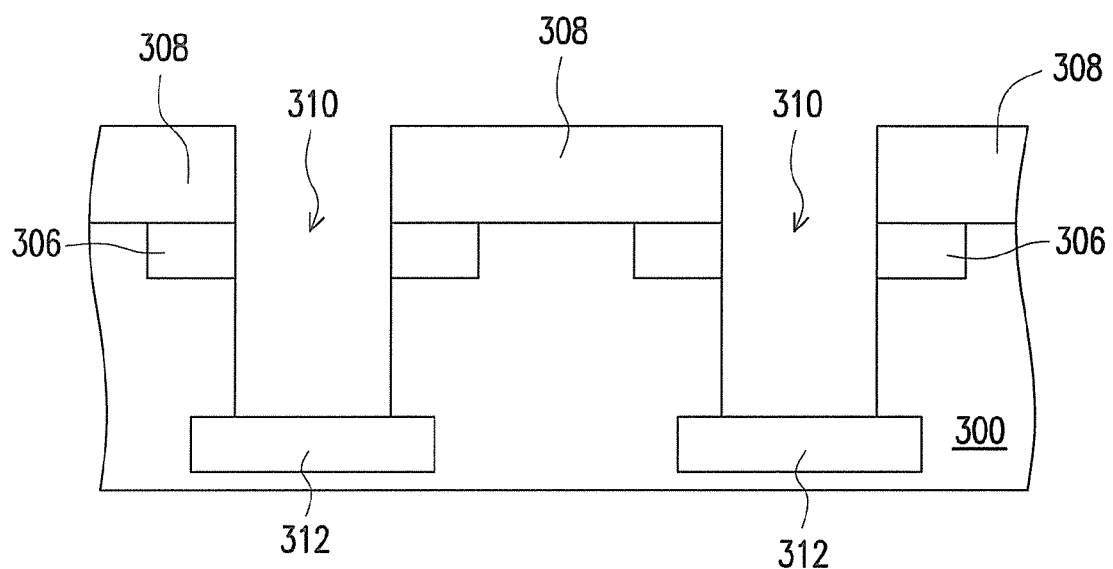
Figure 3C:
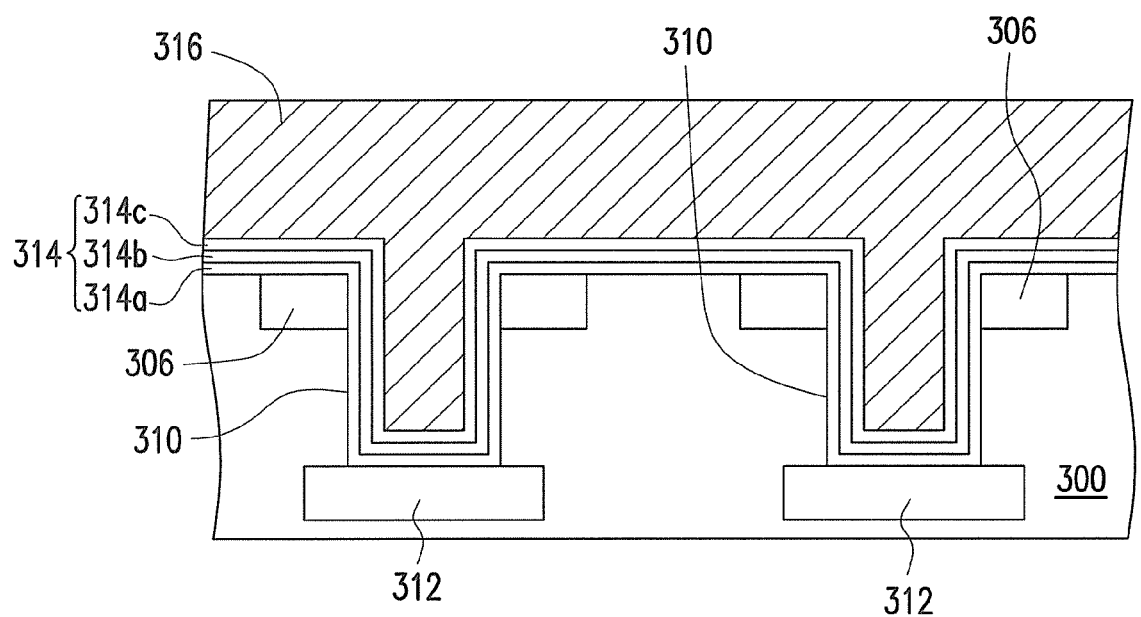

FIGS. 3A through 3C are cross-sectional views illustrating a method for manufacturing a non-volatile memory according to one preferred embodiment of the present invention.

As shown in FIG. 3A, a substrate 300 is provided. A patterned mask layer 302 is formed on the substrate 300. The patterned mask layer 302 can be, for example but not limited to, a photoresist layer. The method for forming the patterned mask layer 302 comprises steps of forming a photoresist layer (not shown) over the substrate 300 and then performing an exposure and development process on the photoresist layer.

Then, several first doped regions 306 are formed in a portion of the substrate 300 exposed by the patterned mask layer 302. The first doped regions 306 can be, for example but not limited to, N-type doped regions. The method for forming the first doped regions 306 comprises a step of performing an ion implantation process for implanting phosphorous ions into the substrate 300 by using the patterned mask layer 302 as a mask.

As shown in FIG. 3B, the patterned mask layer 302 is removed. A patterned mask layer 308 is formed over the substrate 300 to expose a portion of the first doped regions 306. The patterned mask layer 308 can be, for example but not limited to, a photoresist layer. The method for forming the patterned mask layer 308 comprises steps of forming a photoresist layer (not shown) over the substrate 300 and then performing an exposure and development process on the photoresist layer.

By using the patterned mask layer 308 as mask, an etching process is performed on the substrate 300 to form several trenches 310 in the substrate 300. The etching process can be, for example but not limited to, a dry etching process.

Then, several second doped regions 312 are formed in a portion of the substrate 300 under the bottom of the trenches 310 respectively. The second doped regions 312 can be, for example but not limited to, N-type doped regions. The method for forming the second doped regions 312 comprises a step of performing an ion implantation process for implanting phosphorous ions into the substrate 300 by using the patterned mask layer 308 as mask.

As shown in FIG. 3C, the patterned mask layer 308 is removed. The method for removing the patterned mask layer 308 includes a dry etching process.

Then, a complex dielectric layer 314 is conformally formed over the substrate 300. The method for forming the complex dielectric layer 314 comprises steps of forming a bottom dielectric layer 314a, a charge storage layer 314b and a top dielectric layer 314c over the substrate 300 sequentially. The bottom dielectric layer 314a can be, for example but not limited to, formed from silicon oxide by using thermal oxidation or CVD. The charge storage layer 314b can be, for example but not limited to, formed from silicon nitride by using CVD. Also, the top dielectric layer 314c can be, for example but not limited to, formed from silicon oxide by using CVD.

Thereafter, a conductive layer 316 is formed over the substrate 300. The conductive layer 316 covers the complex dielectric layer 314 and fills in the trenches 310. The conductive layer 316 can be, for example but not limited to, formed from doped polysilicon by using polysilicon CVD with in-situ dopping.

The memory formed by applying the aforementioned method has the vertical memory structure and the horizontal memory structure. That is, the memory is a 3-bit-per-cell non-volatile memory with relatively high storage density.

Altogether, the present invention has the following advantages:

(1) The non-volatile memory of the present invention has the vertical memory structure and the horizontal memory structure and is a 3-bit-per-cell non-volatile memory. Therefore, the number of the bit storing in a unit cell is increased.

(2) According to the present invention, there are three storage regions in a single memory cell so that the storage density of the memory of the present invention is relatively high.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A method for manufacturing a non-volatile memory, comprising:
    providing a substrate;
    forming a patterned mask layer on the substrate;
    forming a plurality of first doped regions in the substrate exposed by the patterned mask layer;
    forming a spacer on the sidewall of the patterned mask layer, wherein the spacer covers a portion of the first doped region;
    forming a plurality of trenches in the substrate exposed by the patterned mask layer and the spacer;

forming the second doped regions under the bottoms of the trenches in the substrate exposed by the patterned mask layer and the spacer;

removing the patterned mask layer and the spacer;

forming a plurality of second doped regions in a portion of the substrate under the bottoms of the trenches respectively;

forming a charge storage layer conformal to a surface of the substrate; and forming a conductive layer over the substrate, wherein the conductive layer covers the charge storage layer and fills in the trenches.

2. The method of claim 1, wherein the spacer is made of silicon nitride or silicon oxide.

3. The method of claim 1, wherein the method for forming the spacer comprises steps of:

forming a dielectric layer over the substrate, wherein the dielectric layer covers the patterned mask layer; and performing a dry etching process on the dielectric layer.

4. The method of claim 1, wherein the method for forming the trenches and the second doped regions comprises steps of:

forming a patterned mask layer on the substrate to expose a portion of the first doped regions respectively;

forming the trenches in a portion of the substrate exposed by the patterned mask layer;

forming the second doped regions in the substrate under the bottoms of the trenches respectively; and removing the patterned mask layer.

5. The method of claim 1, wherein the charge storage layer is made of silicon nitride.

6. The method of claim 1 further comprising a step of forming a first dielectric layer between the charge storage layer and the substrate.

7. The method claim 6, wherein the first dielectric layer is made of silicon oxide.

8. The method of claim 1 further comprising a step of forming a second dielectric layer between the charge storage layer and the conductive layer.

9. The method of claim 8, wherein the second dielectric layer is made of silicon oxide.

\* \* \* \* \*